US008665450B2

(12) United States Patent
Johnson et al.

(10) Patent No.: US 8,665,450 B2
(45) Date of Patent: Mar. 4, 2014

(54) INTEGRATED DUAL SWEPT SOURCE FOR OCT MEDICAL IMAGING

(75) Inventors: Bartley C. Johnson, North Andover, MA (US); Walid A. Atia, Lexington, MA (US); Mark E. Kuznetsov, Lexington, MA (US); Dale C. Flanders, Lexington, MA (US)

(73) Assignee: Axsun Technologies, Inc., Billerica, MA (US)

( * ) Notice: Subject to any disclaimer, the term of this patent is extended or adjusted under 35 U.S.C. 154(b) by 643 days.

(21) Appl. No.: 12/572,925

(22) Filed: Oct. 2, 2009

(65) Prior Publication Data
US 2011/0080591 A1 Apr. 7, 2011

(51) Int. Cl.
*G01B 9/02* (2006.01)

(52) U.S. Cl.
USPC ............................................. 356/497

(58) Field of Classification Search
USPC ......................... 356/479, 497, 504
See application file for complete search history.

(56) References Cited

U.S. PATENT DOCUMENTS

| 6,256,102 | B1 | 7/2001 | Dogariu |
| 6,373,632 | B1 | 4/2002 | Flanders |
| 6,570,659 | B2 | 5/2003 | Schmitt |
| 6,608,711 | B2 | 8/2003 | Flanders et al. |
| 7,061,618 | B2 | 6/2006 | Atia et al. |
| 7,391,520 | B2 | 6/2008 | Zhou et al. |
| 7,415,049 | B2 | 8/2008 | Flanders et al. |
| 7,538,884 | B2 * | 5/2009 | Teramura et al. ............. 356/489 |
| 7,545,504 | B2 * | 6/2009 | Buckland et al. ............. 356/495 |
| 7,554,668 | B2 | 6/2009 | Zhou et al. |
| 7,570,364 | B2 * | 8/2009 | Kuroiwa ........................ 356/479 |
| 7,573,021 | B2 * | 8/2009 | Haber et al. .............. 250/227.14 |
| 7,852,484 | B2 * | 12/2010 | Teramura ....................... 356/479 |
| 2008/0140325 | A1 * | 6/2008 | Teramura ......................... 702/57 |
| 2010/0134803 | A1 * | 6/2010 | Baier et al. ..................... 356/498 |
| 2011/0051148 | A1 | 3/2011 | Flanders et al. |

OTHER PUBLICATIONS

Aguirre, A., et al., "Continuum generation in a novel photonic crystal fiber for ultrahigh resolution optical coherence tomography at 800 nm and 1300 nm," Optics Express, vol. 14, No. 3, Feb. 6, 2006, pp. 1145-1160.

Eigenwillig, et al., "Wavelength swept ASE source," conference Title: Optical Coherence Tomography and Coherence Techniques IV, Munich, Germany, Proc. of SPIE vol. 7372, Jul. 13, 2009, pp. 737200-1 to 737200-6.

Kray, S., et al., "High-resolution simultaneous dual-band spectral domain optical coherence tomography," Optics Letters, vol. 34, No. 13, Jul. 1, 2009, pp. 1970-1972.

(Continued)

*Primary Examiner* — Hwa Lee
(74) *Attorney, Agent, or Firm* — Houston & Associates, LLP

(57) ABSTRACT

An optical coherence analysis system comprising: a first swept source that generates a first optical signal that is tuned over a first spectral scan band, a second swept source that generates a second optical signal that is tuned over a second spectral scan band, a combiner for combining the first optical signal and the second optical signal to form a combined optical signal, an interferometer for dividing the combined optical signal between a reference arm leading to a reference reflector and a sample arm leading to a sample, and a detector system for detecting an interference signal generated from the combined optical signal from the reference arm and from the sample arm.

17 Claims, 9 Drawing Sheets

(56) References Cited

OTHER PUBLICATIONS

Sacchet, D., et al., "Simultaneous dual-band ultra-high resolution full-field optical coherence tomography," Optics Express, No. 16, No. 24, Nov. 24, 2008, pp. 19434-19446.

Spöler, F., "Simultaneous dual-band ultra-high resolution optical coherence tomography," Optics Express, vol. 15, No. 17, Aug. 20, 2007, pp. 10832-10841.

Zhou, C. et al., "Dual channel dual focus optical coherence tomography for imaging accommodation of the eye," Optics Express, vol. 17, No. 11, May 25, 2009, pp. 8947-8955.

U.S. Appl. No. 12/533,295, filed Sep. 3, 2009, entitled "Filtered ASE Swept Source for OCT Medical Imaging," by D. Flanders et al.

* cited by examiner

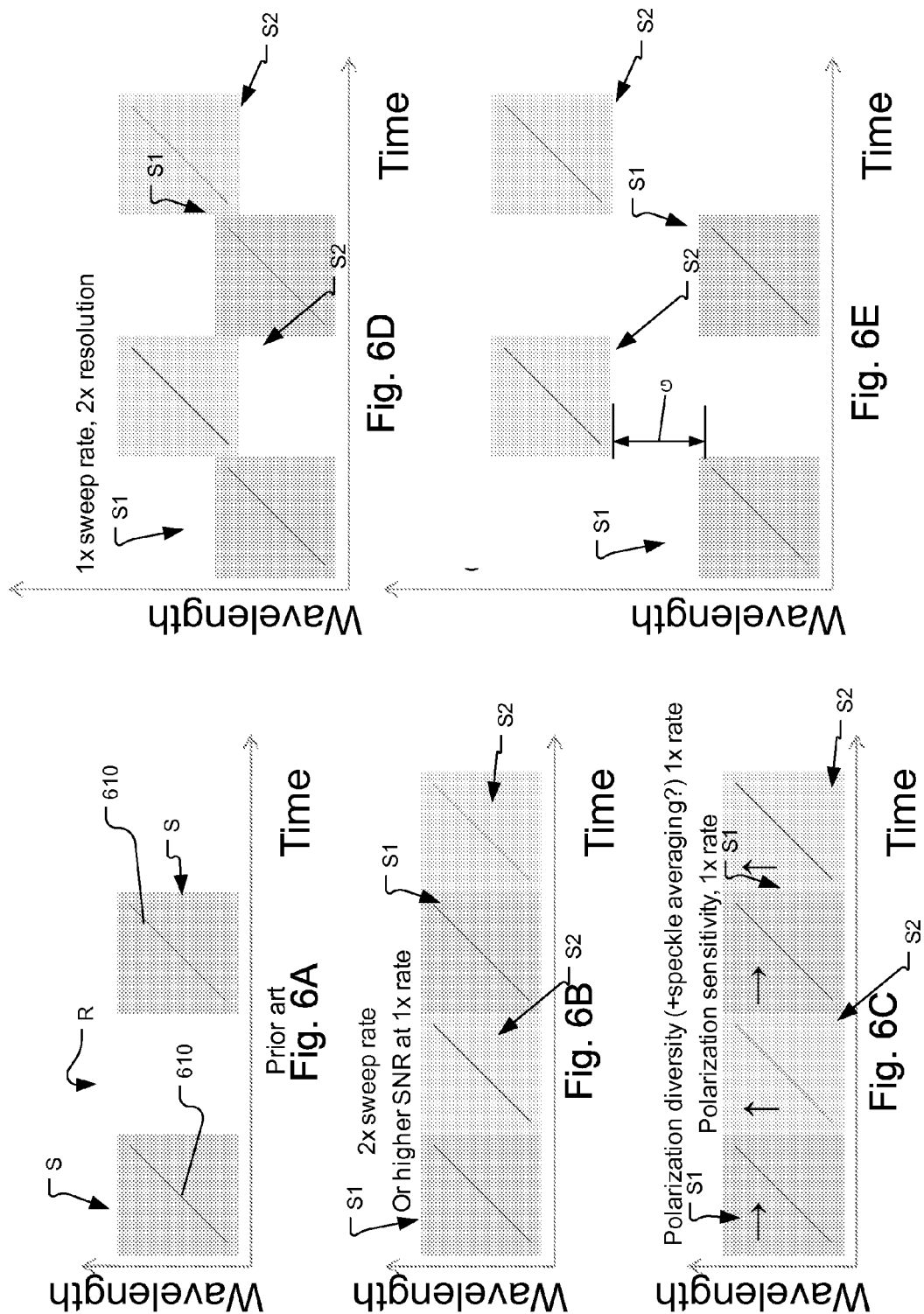

INTEGRATED DUAL SWEPT SOURCE FOR OCT MEDICAL IMAGING

BACKGROUND OF THE INVENTION

Optical coherence analysis relies on the use of the interference phenomena between a reference wave and an experimental wave or between two parts of an experimental wave to measure distances and thicknesses, and calculate indices of refraction of a sample. Optical Coherence Tomography (OCT) is one example technology that is used to perform usually high-resolution cross sectional imaging. It is often applied to imaging biological tissue structures, for example, on microscopic scales in real time. Optical waves are reflected from an object or sample and a computer produces images of cross sections of the object by using information on how the waves are changed upon reflection.

The original OCT imaging technique was time-domain OCT (TD-OCT), which used a movable reference mirror in a Michelson interferometer arrangement. In order to increase performance, variants of this technique have been developed using two wavelengths in so-called dual band OCT systems.

In parallel Fourier domain OCT (FD-OCT) techniques have been developed. One example is time-encoded OCT, which uses a wavelength swept source and a single detector; it is sometimes referred to as time-encoded FD-OCT (TEFD-OCT) or swept source OCT. Another example is spectrum encoded OCT, which uses a broadband source and spectrally resolving detector system and is sometimes referred to as spectrum-encoded FD-OCT or SEFD-OCT.

Interestingly, these three OCT techniques, TD-OCT, TEFD-OCT, and SEFD-OCT, parallel the three spectrometer architectures of Fourier Transform spectrometers, tunable laser spectrometers, and dispersive grating with detector array spectrometers.

These various OCT techniques offer different performance characteristics. FD-OCT has advantages over TD-OCT in speed and signal-to-noise ratio (SNR). Of the two FD-OCT techniques, swept-source OCT or TEFD-OCT has distinct advantages over spectrum-encoded FD-OCT or SEFD-OCT because of its capability of balanced and polarization diversity detection; it has advantages as well for imaging in wavelength regions where inexpensive and fast detector arrays, which are typically required for SEFD-OCT, are not available.

TEFD-OCT or swept source OCT has advantages over SEFD-OCT in some additional respects. The spectral components are not encoded by spatial separation, but they are encoded in time. The spectrum is either filtered or generated in successive frequency steps and reconstructed before Fourier-transformation. Using the frequency scanning swept source, the optical configuration becomes less complex but the critical performance characteristics now reside in the source and especially its tuning speed and accuracy.

The swept sources for TEFD-OCT systems have been typically tunable lasers. The advantages of tunable lasers include high spectral brightness and relatively simple optical designs. The typical tunable laser is constructed from a gain medium, such as a semiconductor optical amplifier (SOA), and a tunable filter such as a rotating grating, grating with a rotating mirror, or a Fabry-Perot tunable filter. Currently, some of the highest speed TEFD-OCT lasers are based on the laser designs described in U.S. Pat. No. 7,415,049 B1, entitled Laser with Tilted Multi Spatial Mode Resonator Tuning Element, by D. Flanders, M. Kuznetsov and W. Atia. This highly integrated design allows for a short laser cavity that keeps the round-trip optical travel times within the laser short so that the laser is fundamentally capable of high speed tuning Secondly, the use of micro-electro-mechanical system (MEMS) Fabry-Perot tunable filters combines the capability for wide spectral scan bands with the low mass high mechanical resonant frequency deflectable MEMS membranes that can be tuned quickly.

Another class of swept sources that have the potential to avoid inherent drawbacks of tunable lasers is filtered amplified spontaneous emission (ASE) sources that combine a broadband light source, typically a source that generates light by ASE, with tunable filters and amplifiers.

Some of the highest speed devices based on filtered ASE sources are described in U.S. Pat. No. 7,061,618 B2, entitled Integrated Spectroscopy System, by W. Atia, D. Flanders P. Kotidis, and M. Kuznetsov, which describes spectroscopy engines for diffuse reflectance spectroscopy and other spectroscopic applications. A number of variants of the filtered ASE swept source are described, including amplified versions and versions with tracking filters.

More recently Eigenwillig, et al. have proposed a variant configuration of the filtered ASE source in an article entitled "Wavelength swept ASE source", Conference Title: Optical Coherence Tomography and Coherence Techniques IV, Munich, Germany, Proc. SPIE 7372, 737200 (Jul. 13, 2009). The article describes an SOA functioning both as an ASE source and first amplification stage. Two Fabry-Perot tunable filters are used in a primary-tracking filter arrangement, which are followed by a second SOA amplification stage. Also, U.S. patent application Ser. No. 12/553,295, filed on Sep. 3, 2009, now U.S. Pat. Appl. Pub. No. US 2011/0051148 A1, entitled Filtered ASE Swept Source for OCT Medical Imaging, by D. Flanders, W. Atia, and M. Kuznetsov, which is incorporated herein in its entirety by this reference, lays out various integrated, high speed filtered ASE swept source configurations.

SUMMARY OF THE INVENTION

The market demands higher resolution and higher speed OCT systems. Physical limits exist with current technology in terms of the spectral width of the scan band, tuning speed, and realistic scan duty cycles. The present approach addresses such problems by using multiple swept sources that scan simultaneously or in an interleaved fashion.

In general, according to one aspect, the invention features an optical coherence analysis system comprising: a first swept source that generates a first optical signal that is tuned over a first spectral scan band, a second swept source that generates a second optical signal that is tuned over a second spectral scan band, a combiner for combining the first optical signal and the second optical signal to form a combined optical signal, an interferometer for dividing the combined optical signal between a reference arm leading to a reference reflector and a sample arm leading to a sample, and a detector system for detecting an interference signal generated from the combined optical signal from the reference arm and from the sample arm.

In one embodiment, each of the first swept source and the second swept source comprises a laser cavity having at least two reflectors, which define the longitudinal cavity modes, a semiconductor gain medium in the laser cavity, and a tuning element for the laser cavity.

In another embodiment, each of the first swept source and the second swept source comprises a source for generating broadband light; and a first tunable filter for spectrally filtering the broadband light from the broadband source to generate the tunable optical signal. Further possible elements include an amplifier for amplifying the tunable optical signal and a second tunable filter (tracking filter) for spectrally further filtering the amplified tunable optical signal from the amplifier.

Preferably, MEMS Fabry-Perot tunable filters are used in these embodiments.

In one embodiment, the combiner comprises a WDM combiner. In other examples, it includes a 50/50 beam splitter, a polarization beam combiner, and/or beam switch.

In some embodiments, first spectral scan band and the second spectral scan band are substantially the same, while they are scanned at different, for example alternating, time multiplexed periods, in some examples. In other examples, the first spectral scan band and the second spectral scan band are non-overlapping or contiguous spectral scan bands.

In general according to another aspect, the invention features an optical coherence analysis method, comprising generating a first optical signal that is tuned over a first spectral scan band, generating a second optical signal that is tuned over a second spectral scan band, combining the first optical signal and the second optical signal to form a combined optical signal, dividing the combined optical signal between a reference arm leading to a reference reflector and a sample arm leading to a sample, and detecting an interference signal generated from the combined optical signal from the reference arm and from the sample arm.

In general according to still another aspect, the invention features an optical coherence analysis system comprising a micro optical bench, a first source that generates a first optical signal on the micro optical bench, a second source that generates a second optical signal on the micro optical bench, a combiner, on the optical bench, for combining the first optical signal and the second optical signal—forming a combined optical signal. An interferometer divides the combined optical signal between a reference arm leading to a reference reflector and a sample arm leading to a sample. A detector system detects an interference signal generated from the combined optical signal from the reference arm and from the sample arm.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIGS. 6A-6F are plots of wavelength as a function of time showing swept source scanning, with FIG. 6A showing conventional scanning, FIG. 6B showing time multiplexed scanning over a common scan band, FIG. 6C showing time multiplexed scanning over a common scan band with polarization diversity, FIG. 6D showing time multiplexed scanning over a different contiguous scan bands, FIG. 6E showing time multiplexed scanning over different, non-overlapping scan bands with a guard band, and FIG. 6F showing simultaneous scanning over a different scan bands;

DETAILED DESCRIPTION OF THE PREFERRED EMBODIMENTS

Figure 1:
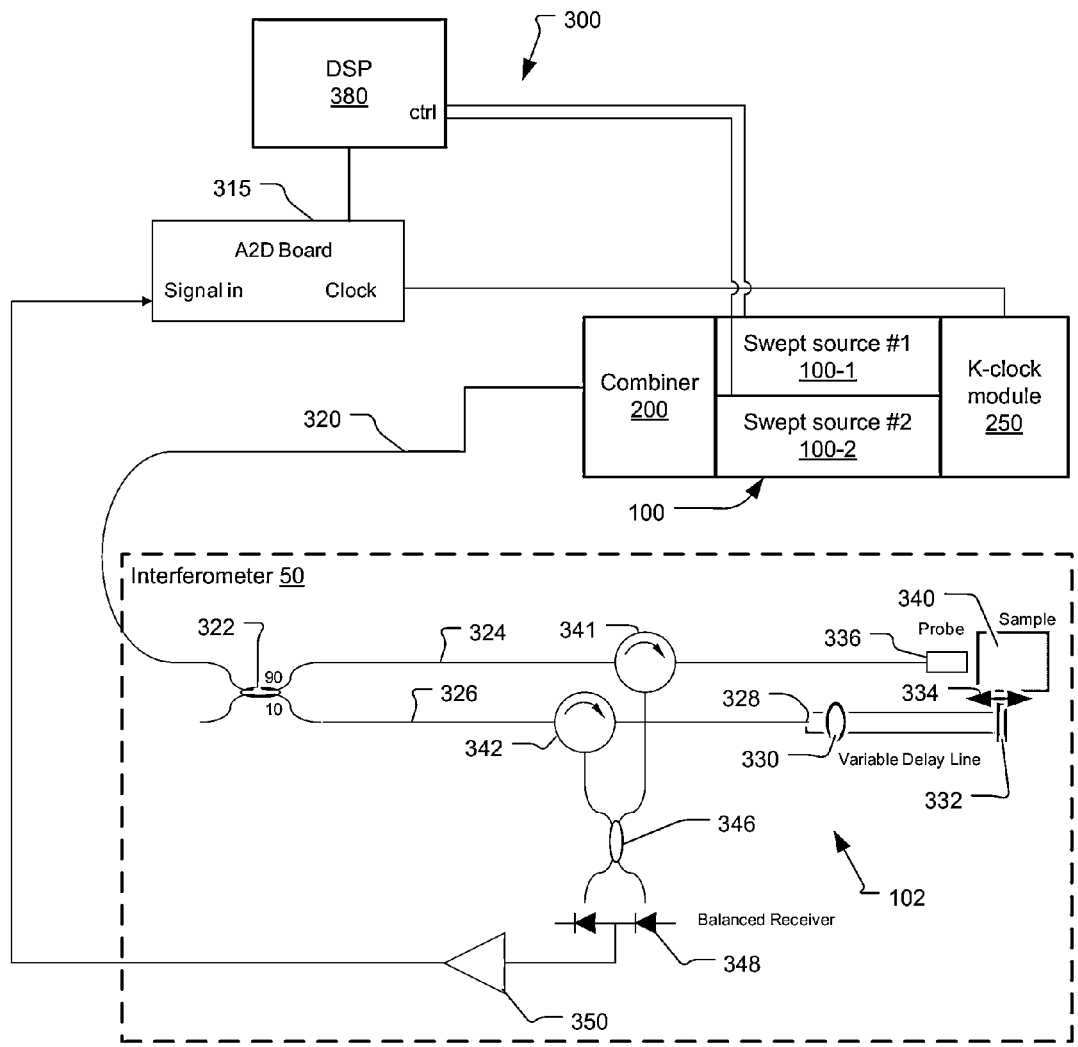
FIG. 1 is a schematic view of an OCT system with a dual swept source according to an embodiment of the invention.

FIG. 1 shows an optical coherence analysis system 300 using the integrated dual swept source 100, which has been constructed according to the principles of the present invention.

The integrated dual swept source system 100 generates a combined optical signal on optical fiber 320 that is transmitted to interferometer 50. In the preferred embodiment, this combined optical signal is a tunable optical signal that scans over a combined scanband with a narrowband emission.

The integrated dual swept source system 100 comprises a first swept source 100-1 and a second swept source 100-2. Each of these individual swept sources generates respective tunable optical signals, a first optical signal and a second optical signal. The first optical signal and the second optical signal are combined into the combined optical signal by a combiner 200 and coupled onto the optical fiber 320.

In one embodiment, the first swept source 100-1 and a second swept source 100-2 of the integrated dual swept source system 100 are operated in a time-multiplexed "ping-pong" fashion. At any given instant, the combined optical signal on optical fiber 320 is derived from only one of the swept sources 100-1, 100-2.

Preferably, the integrated dual swept source system 100 also further comprises a k-clock module 250. The k-clock module generates a clocking signal at equally spaced optical frequency increments as the combined tunable optical signal is tuned over the combined scan band.

In the current embodiment, a interferometer 50 is used to analyze the optical signals from the sample 340. The combined tunable signal from the swept source module 100 is transmitted on fiber 320 to a 90/10 optical coupler 322. The combined tunable signal is divided by the coupler 322 between a reference arm 326 and a sample arm 324 of the system.

The optical fiber of the reference arm 326 terminates at the fiber endface 328. The light exiting from the reference arm fiber endface 328 is collimated by a lens 330 and then reflected by a mirror 332 to return back, in some exemplary implementations.

The external mirror 332 has an adjustable fiber to mirror distance (see arrow 334), in one example. This distance determines the depth range being imaged, i.e. the position in the sample 340 of the zero path length difference between the reference arm 326 and the sample arm 324. The distance is adjusted for different sampling probes and/or imaged samples. Light returning from the reference mirror 332 is returned to a reference arm circulator 342 and directed to a 50/50 fiber coupler 346.

The fiber on the sample arm 324 terminates at the sample arm probe 336. The exiting light is focused by the probe 336 onto the sample 340. Light returning from the sample 340 is returned to a sample arm circulator 341 and directed to the 50/50 fiber coupler 346. The reference arm signal and the sample arm signal are combined in the fiber coupler 346 to generate an interference signal. The interference signal is detected by a balanced receiver, comprising two detectors 348, at each of the outputs of the fiber coupler 346. The electronic interference signal from the balanced receiver 348 is amplified by amplifier 350.

Since the first swept source 100-1 and a second swept source 100-2 are operated in a time-multiplexed "ping-pong" fashion, only a single channel receiver is required to detect the interference signal.

An analog to digital converter system 315 is used to sample the interference signal output from the amplifier 350. Frequency clock and sweep trigger signals derived from the k-clock module 250 of the dual swept source 100 are used by the analog to digital converter system 315 to synchronize system data acquisition with the frequency tuning of the swept source 100.

Once a complete data set has been collected from the sample 340 by spatially raster scanning the focused probe beam point over the sample, in a Cartesian geometry, x-y, fashion or a cylindrical geometry theta-z fashion, and the spectral response at each one of these points is generated from the frequency tuning of the dual swept source 100, the digital signal processor 380 performs a Fourier transform on the data in order to reconstruct the image and perform a 2D or 3D tomographic reconstruction of the sample 340. This information generated by the digital signal processor 380 can then be displayed on a video monitor.

Figure 2:
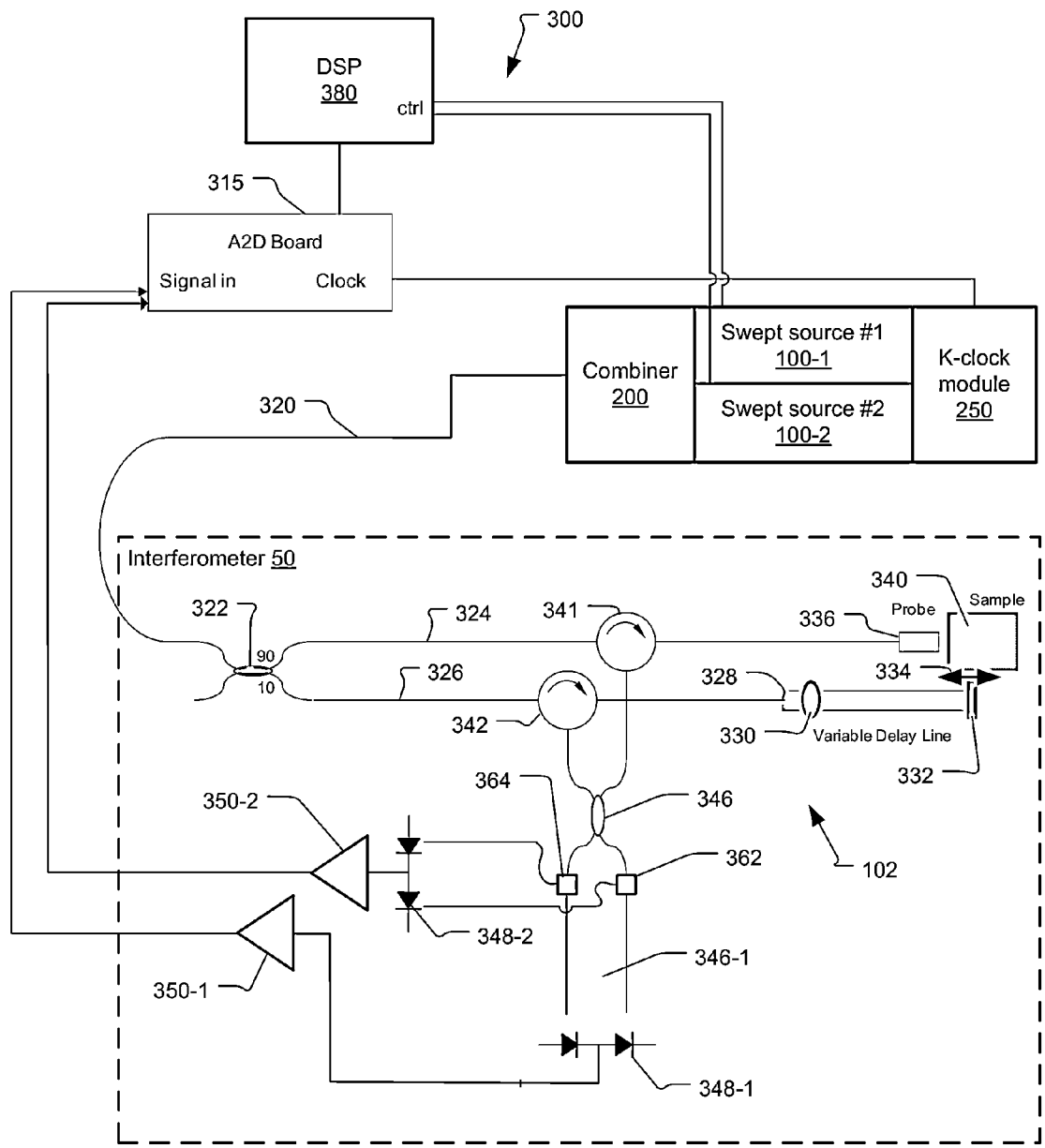
FIG. 2 is a schematic view of an OCT system with a dual swept source according to another embodiment of the invention incorporating a wavelength and/or polarization diversity optical receiver.

FIG. 2 shows an optical coherence analysis system 300 that has been constructed according to a second embodiment of the present invention.

In this second embodiment, the dual swept source 100 and specifically the first swept source 100-1 and the second swept source 100-2 are not necessarily operated in a ping-pong fashion. At least, it is not a requirement that they are operated in this fashion. Instead, the first tunable optical signal from the first swept source 100-1 and the second tunable optical signal from the second swept source 100-2 are separated either in wavelength and/or polarization. As a result, the combined optical signal on optical fiber 320 in one implementation of this embodiment, is at any instant a combination of the first tunable optical signal and the second tunable optical signal.

To deal with this situation, the detector system has the capacity to separate the interference signal into portions derived from first tunable optical signal and the second tunable optical signal prior to detection. In one embodiment, a first wavelength division multiplexing (WDM) splitter 362 and a second WDM splitter 364 are used to separate the spectral components of the interference signal generated by coupler 346. In a different embodiment, polarization beam splitters are used for elements 362 and 364.

In either case, two balanced detectors 348-1 and 348-2 are used to separately detect the interference signals that result from the first tunable optical signal from the first swept source 100-1 and the second tunable optical signal that is generated by the second swept source 100-2. Separate amplifiers 350-1 and 350-2 are provided, and the analog to digital conversion board 315 includes two channels to enable simultaneous detection of the output of amplifiers 350-1 and 350-2.

It should be noted that while the illustrated embodiment is shown with two swept-sources and two detection channels, more than two swept sources and more than two corresponding detection channels are used in still further embodiments. In such implementations, a WDM combiner 200 is used to combine multiple swept sources 100-1 to 100-n, such as n=4 or 6 or more sources. WDM splitters are then used to separate out the interference signals associated with the different swept sources for detection at 348-1 to 348-n detectors.

Figure 3:
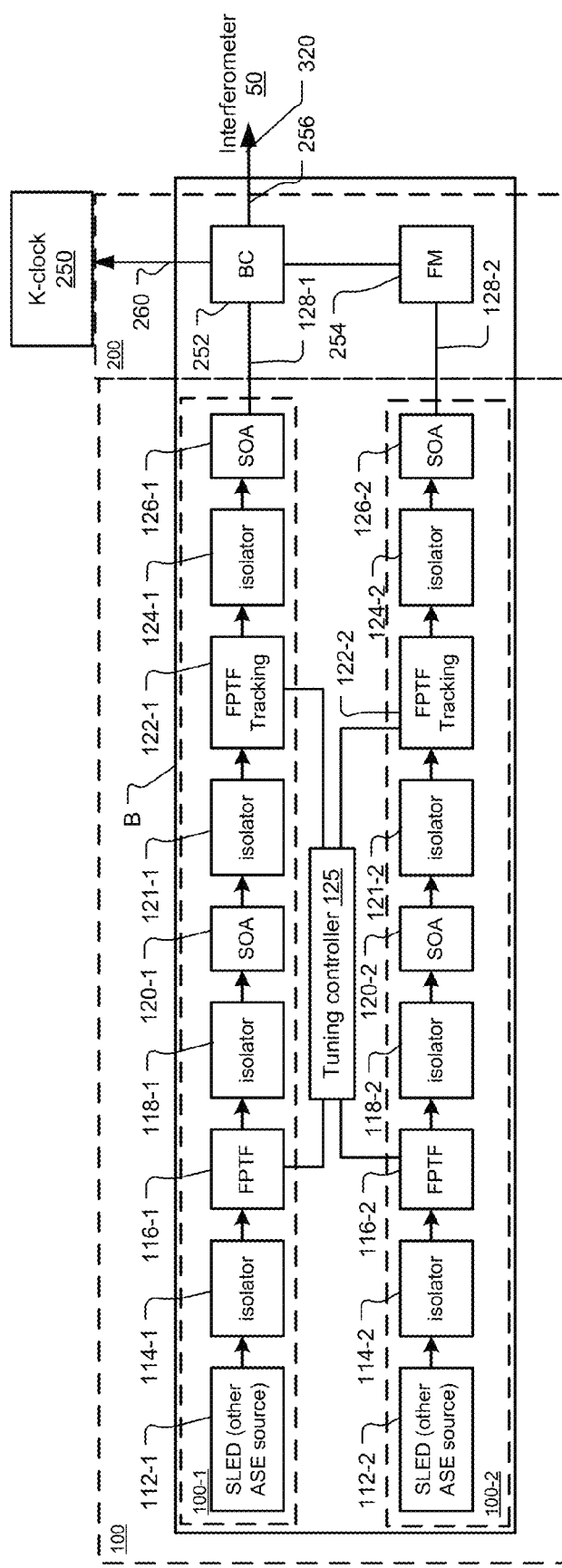
FIG. 3 is a block diagram of a dual filtered ASE swept optical source according to the present invention.

FIG. 3 shows a first embodiment of the dual swept optical source 100 that has been constructed according to the principles of the present invention.

The first and the second swept sources 100-1 and 100-2 are each filtered amplified spontaneous emission sources. In the current embodiments these ASE swept sources 100-1 and 100-2 are any one of ASE swept sources described in U.S. patent application Ser. No. 12/553,295, entitled Filtered ASE Swept Source for OCT Medical Imaging, filed on Sep. 3, 2009 by Flanders, et al. Additionally, other amplified ASE swept sources could be used in still further examples. Nevertheless, the following example is provided based on one of the swept source configurations of this incorporated document.

In more detail, the swept sources 100-1, 100-2 each comprise a broadband source 112-1, 112-2 that generates a broadband optical signal. In general, the broadband signal is characterized by a continuous spectrum that extends in wavelength over at least 40 nanometers (nm) of bandwidth, full width half maximum (FWHM). Typically, the continuous spectrum extends over at least 70 nm and preferably over 100 nm or greater.

In the preferred embodiment, the broadband sources 112-1, 112-2 are electrically pumped semiconductor chip gain media that are bonded or attached to a common bench B. Examples of the sources 112-1, 112-2 include superluminescent light emitting diodes (SLED) and semiconductor optical amplifiers (SOA). The material systems of the chips are selected based on the desired spectral operating range for each of the first and the second swept sources 100-1 and 100-2. Common material systems are based on III-V semiconductor materials, including binary materials, such as GaN, GaAs, InP, GaSb, InAs, as well as ternary, quaternary, and pentenary alloys, such as InGaN, InAlGaN, InGaP, AlGaAs, InGaAs, GaInNAs, GaInNAsSb, AlInGaAs, InGaAsP, AlGaAsSb, AlGaInAsSb, AlAsSb, InGaSb, InAsSb, and InGaAsSb. Collectively, these material systems support operating wavelengths from about 400 nm to 2000 nm, including longer wavelength ranges extending into multiple micrometer wavelengths. Semiconductor quantum well and quantum dot gain regions are typically used to obtain especially wide gain and spectral emission bandwidths. Currently, edge-emitting chips are used although vertical cavity surface emitting laser (VCSEL) chips are used in different implementations.

The use of semiconductor chip gain media for the first and the second swept sources 100-1 and 100-2 has advantages in terms of system integration since these semiconductor chips can be bonded to submounts that in turn are directly bonded to the common bench B. Other possible gain media can be used in other implementations, however. In these examples, the broadband signal is typically transmitted via optical fiber to the bench B. Such examples include solid state gain media, such as rare-earth (e.g., Yb, Er, Tm) doped bulk glass, waveguides or optical fiber.

In these examples, the output facets of the chips or gain waveguides/fibers are antireflection coated, and possibly angled, so that the gain media do not lase but instead generate broadband light via amplified spontaneous emission (ASE).

In some embodiments, the broadband sources 112-1, 112-2 have different operating or spectral emissions to form separate non-overlapping spectral bands. In other examples, the spectral bands of the broadband sources 112-1, 112-2, are contiguous or potentially overlapping. As a result, the broadband sources 112-1, 112-2 are in some examples chips made out of different material systems.

The use of sources with complementary spectral bands enables the dual swept source system 100 to generate a combined tunable optical signal that covers a wider wavelength scanning range. This translates into a higher spatial (depth) resolution for the imaging system. Alternatively, the two different spectral bands can provide complementary information about the sample, such as different penetration depth into the sample and different sample image contrast.

The use of two swept sources with substantially the same spectral band but multiplexed in alternating time slots in a "ping pong" fashion allows higher duty cycle for data acquisition and better frequency tuning linearity of each of the two sources. This "ping pong" dual laser approach can be used advantageously instead of the standard optical buffering approach in high speed OCT, where two copies of the optical signal from a single swept source are time multiplexed after time delaying one of the signal copies in a long length of optical fiber. The advantage of the dual laser approach is that, unlike the case with optical buffering, it does not require a long length of fiber with its possible strong dispersion that strongly degrades imaging resolution.

Another major benefit of the ping-pong laser approach is the 2× higher attainable duty cycle, which relaxes the maximum data acquisition frequency requirements for a given scan range and scan speed by a factor of 2, allowing for lower cost data acquisition components or faster scan speeds.

In other examples, the broadband sources 112-1, 112-2 generate broadband signals that have different polarizations, such as orthogonal polarizations. The advantage here is that the optical signals from the separate broadband sources provide polarization diversity sample illumination and signal detection such as to eliminate polarization sensitivity of the imaging system and eliminate polarization artifacts in the image. Alternatively, the two orthogonal polarizations can be used for polarization sensitive imaging that can enhance imaging contrast of specific regions of interest in the sample.

The bench B is termed a micro-optical bench and is preferably less than 20 millimeters (mm) in width and about 50 mm in length or less. This size enables the bench to be installed in a standard, or near standard-sized, butterfly or DIP (dual inline package) hermetic package. In one implementation, the bench B is fabricated from aluminum nitride. A thermoelectric cooler is disposed between the bench B and the package (attached/solder bonded both to the backside of the bench and inner bottom panel of the package) to control the temperature of the bench B.

The broadband optical signals from the broadband sources 112-1, 112-2 are coupled to respective isolators 114-1, 114-2, which are preferably also bonded or attached to the bench B. These isolators 114-1, 114-2 prevent feedback into the broadband sources 112-1, 112-2 that might cause them to lase or otherwise change, e.g. produce ripple in, the emission spectrum of the broadband optical signal from the broadband sources.

First-stage tunable filters 116-1, 116-2 function as tunable bandpass filters to convert the broadband signals to narrow band tunable signals, the first and second tunable signals. In a current embodiment, the passband of the first stage tunable filters have a full width half maximum (FWHM) bandwidths of less than 20 or 10 GigaHertz (GHz), and are preferably 5 GHz or less. For spectroscopy this relatively narrow passband yields high spectral resolution. For optical coherence tomography, this high spectral resolution implies long coherence length of the source and therefore enables imaging deeper into samples, for example deeper than 5 mm. In lower performance applications, for example OCT imaging less than 1 mm deep into samples, broader FWHM passbands are sometimes appropriate, such as passbands of about 200 GHz or less.

The first-stage tunable filters 116-1, 116-2 are scanned over a first spectral scan band and a second spectral scan band, respectively. In some implementations, first spectral scan band and the second spectral scan bands are non-overlapping, contiguous, overlapping, or the same scan bands. Generally, the scan bands of first-stage tunable filters 116-1, 116-2 are matched to the corresponding emission spectral bands of the respective broadband sources 112-1, 112-2.

In the current embodiment, the first stage tunable filters 116-1, 116-2 are Fabry-Perot tunable filters that are fabricated using micro-electro-mechanical systems (MEMS) technology and are attached, such as directly solder bonded, to the bench B. Currently, the filters 116-1, 116-2 are manufactured as described in U.S. Pat. No. 6,608,711 or 6,373,632, which are incorporated herein by this reference. A curved-flat resonator structure is used in which a generally flat mirror and an opposed curved mirror define a filter optical cavity, the optical length of which is modulated by electrostatic deflection of at least one of the mirrors.

The tunable optical signals that are produced by the passband of the first stage tunable filters 116-1, 116-2 are amplified in first stage optical amplifiers 120-1, 120-2 of a first amplification stage. Preferably the first stage optical amplifiers are SOA's with antireflection coated and angled front and rear facets, enabling integration onto the bench B by attachment, typically via a submount.

Second isolators 118-1, 118-2 between the first stage tunable filters 116-1, 116-2 and the first amplifiers 120-1, 120-2 prevent back reflections between the front facets of the first amplifiers 120-1, 120-2 and the first stage tunable filters 116-1, 116-2 from causing lasing or other spectral ripple due to parasitic reflections between these two elements. The second isolators 118-1, 118-2 are preferably also bonded or otherwise attached to the bench B.

The amplified tunable signals from the first stage amplifiers 120-1, 120-2 are again passband filtered by second stage tunable filters 122-1, 122-2. These second stage filters 122-1, 122-2 are preferably tunable MEMS Fabry-Perot filters as described previously and are preferably also similarly solder-bonded or otherwise attached to the bench B. In some implementations, the only difference between the first stage tunable filters 116-1, 116-2 and the second stage tunable filters 122-1, 122-2 are that the second stage tunable filters 122-1, 122-2 have slightly broader passbands than the first stage tunable filters 116-1, 116-2, such as between 2 and 20 times broader in frequency. These second stage filters 122-1, 122-2 are termed tracking filters because they are controlled to scan synchronously with the first stage tunable filters 116-1, 116-2 and thus track tuning of the first stage filters. The tracking filters function primarily to remove ASE noise introduced by the first stage amplifiers 120-1, 120-2 and further spectrally shape and narrow the tunable signal.

The synchronous tracking of the second stage tunable filters 122-1, 122-2 with the first stage tunable filters 116-1, 116-2 is controlled by a tracking controller 125 that drives both filters of both stages and swept sources. Preferably, the tuning controller 125 spectrally centers the passbands of the tracking tunable filters 122-1, 122-2 on passbands of the first stage tunable filters 116-1, 116-2 and then tunes the two passbands together over the scanband extending over the gain bands of the respective broadband sources 112-1, 112-2 and amplifiers 120-1, 120-2, 126-1, 126-2.

Third isolators 121-1, 121-2 between the first stage amplifiers 120-1, 120-2 and the second stage tunable filters 122-1, 122-2 prevent back reflections between the back facets of the first stage amplifiers 120-1, 120-2 and the second stage tunable filters 122-1, 122-2 from causing lasing or other spectral ripple due to parasitic reflections between these two elements. The third isolators 121-1, 121-2 are preferably also bonded or otherwise attached to the bench B.

The amplified tunable optical signals that are produced from the first stage optical amplifiers 120-1, 120-2 and filtered by the tracking filters 122-1, 122-2 are again amplified in second amplifiers 126-1, 126-2 of a second amplification stage. Preferably the second stage optical amplifiers 126-1, 126-2 are also SOA's with antireflection coated and angled front and rear facets, enabling integration onto the bench B by attachment to it. In terms of control, the second stage optical amplifiers 126-1, 126-2 are usually operated in saturation with a lower input saturation power to minimize broadband ASE contribution from this last gain stage.

Fourth isolators 124-1, 124-2 between the front facets of the second stage amplifiers 126-1, 126-2 and the second stage tunable filters 122-1, 122-2 prevent back reflections between the front facet of the second amplifiers 126-1, 126-2 and the second tunable filters 122-1, 122-2 from causing lasing or other spectral ripple due to parasitic reflections between these elements. The fourth isolators 124-1, 124-2 are preferably also bonded or otherwise attached to the bench B.

If required, still further gain stages can be used. In one example third SOAs, third amplification stage, are added. For other applications having still higher power requirements, a rare-earth doped fiber gain stage is added after the second SOAs 126-1, 126-2.

The outputs of each second stage amplifiers 126-1, 126-2 are a first tunable optical signal 128-1 and a second tunable optical signal 128-2. These optical signals are combined in a combiner stage 200 to form a combined optical signal 256 on optical fiber 320. In the preferred embodiment, the elements of the combiner stage 200 are implemented on and secured to the optical bench B.

In one example, the combiner 200 forms the combined optical signal 256 using a WDM filter. In this implementation, a first spectral scan band and the second spectral scan band are non-overlapping spectral scan bands. A fold mirror 254 directs the second tunable optical signal 128-2 to a beam combining element 252, which is a WDM filter that reflects light in the second spectral scan band and transmits light in the first spectral scan band.

In another example, the first tunable optical signal 128-1 and the second tunable optical signal 128-2 have orthogonal polarizations. The signals are combined in the combined signal using a polarization beam combiner as the beam combining element 252. Since this example relies on polarization diversity, it works when the first spectral scan band and the second spectral scan band can be the same, overlapping, contiguous, and non-overlapping. In order to produce the orthogonal polarizations a quarterwave plate is added to the optical path of one of the sources.

In still another example, the first tunable optical signal 128-1 and the second tunable optical signal 128-2 are time multiplexed. Here, the signals are combined in the combined signal using a beam switch as the beam combining element 252 by alternately passing either the first tunable optical signal 128-1 or the second tunable optical signal 128-2 as the combined signal.

In still another example, the beam combining element 252 can be a 50/50 beamsplitter/combiner, where the second optical output of such combiner is used in the input 260 to the K-clock module 250, which generates the k-clock signal for triggering analog-to-digital data acquisition electronics module 315.

Figure 4:
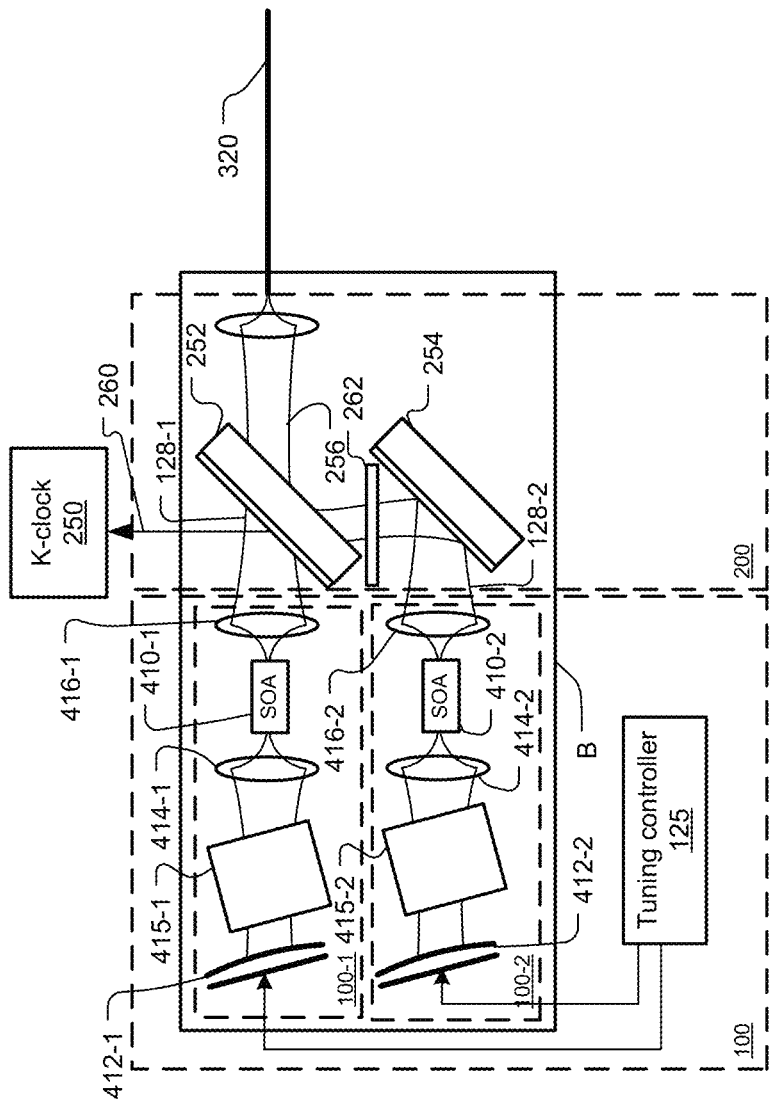
FIG. 4 is a schematic diagram of a dual laser swept optical source according to the present invention.

FIG. 4 shows a second embodiment of the dual swept optical source 100, using laser sources, according to the principles of the present invention.

The first and the second laser swept sources 100-1 and 100-2 are each preferably lasers as described in incorporated U.S. Pat. No. 7,415,049 B1.

In more detail, each of the tunable lasers sources 100-1, 100-2 comprises a semiconductor gain chip 410-1, 410-2 that is paired with a micro-electro-mechanical (MEMS) angled reflective Fabry-Perot tunable filter 412-1, 412-2 to create external cavity tunable laser (ECL) on a common micro-optical bench B.

The semiconductor optical amplifier (SOA) chips 410-1, 410-2 are located within a laser cavity. In the current embodiment, input facets of the SOA chips 410-1, 410-2 are angled and anti-reflection (AR) coated, providing parallel beams from the two facets. The output facets are coated to define one end of the laser cavities, in one example.

Each facet of the SOAs 410-1, 410-2 has associated lenses 414-1, 414-2, 416-1, 416-2 that are used to couple the light exiting from either facet of the SOAs 410-1, 410-2. The first lenses 414-1, 414-2 couple the light between the front facets of the SOAs 410-1, 410-2 and the respective reflective Fabry-Perot tunable filter 412-1, 412-2. Light exiting out the output or front facets of the SOAs 410-1, 410-2 is coupled by a second lenses 416-1, 416-2 to a combiner stage 200.

The angled reflective Fabry-Perot filters 412-1, 412-2 are a multi-spatial-mode tunable filters that provide angular dependent reflective spectral response back into the respective laser cavities. This phenomenon is discussed in more detail in incorporated U.S. Pat. No. 7,415,049 B1.

In one implementation, extender elements 415-1, 415-2 are added to the laser cavities. These are transparent high refractive index material, such as fused silica or silicon or other transmissive material having a refractive index of about 1.5 or higher. Currently silicon is preferred. Both endfaces of the extender elements 415-1, 415-2 are antireflection coated. Further, the element is preferably angled by between 1 and 10 degrees relative to the optical axis of the cavities to further spoil any reflections from the its endfaces from entering into the laser beam optical axis. These extender elements 415-1, 415-2 are used to change the optical distance between the laser intracavity spurious reflectors and thus change the depth position of the spurious peak in the image while not necessarily necessitating a change in the physical distance between the elements.

The combiner stage 200 forms a combined optical signal 256 from the optical signals first tunable optical signal 128-1 and the second tunable optical signal 128-2 generated by the tunable lasers 100-1, 100-2. In the preferred embodiment, the elements of the combiner stage 200 are implemented on and secured to the optical bench B.

In one example, the combiner 200 forms the combined optical signal 256 using a WDM filter 252. In this implementation, a first spectral scan band of tunable laser 100-1 and the second spectral scan band of tunable laser 100-2 are non-overlapping spectral scan bands. A fold mirror 254 directs the second tunable optical signal 128-2 to a beam combining element 252, which is a WDM filter that reflects light in the second spectral scan band and transmits light in the first spectral scan band.

In another example, the first tunable optical signal 128-1 and the second tunable optical signal 128-2 have orthogonal polarizations. A quarter wave plate 262 is used to rotate the polarization of laser 100-2. In other examples, the SOA chips produce optical signals of orthogonal polarizations. The signals are combined in the combined signal using a polarization beam combiner as the beam combining element 252. Since this example relies on polarization diversity, it works when the first spectral scan band and the second spectral scan band are the same, overlapping, contiguous, and non-overlapping.

In still another example, the first tunable optical signal 128-1 and the second tunable optical signal 128-2 are time multiplexed. Here, the signals are combined in the combined signal 256 using a beam switch as the beam combining element 252 by alternately passing either the first tunable optical signal 128-1 or the second tunable optical signal 128-2 as the combined signal.

In still another example, the beam combining element 252 is a 50/50 beamsplitter/combiner, where the second optical output 260 of such combiner 252 is used in the K-clock module 250 for generating the k-clock signal for triggering analog-to-digital data acquisition electronics module 315.

Figure 5:
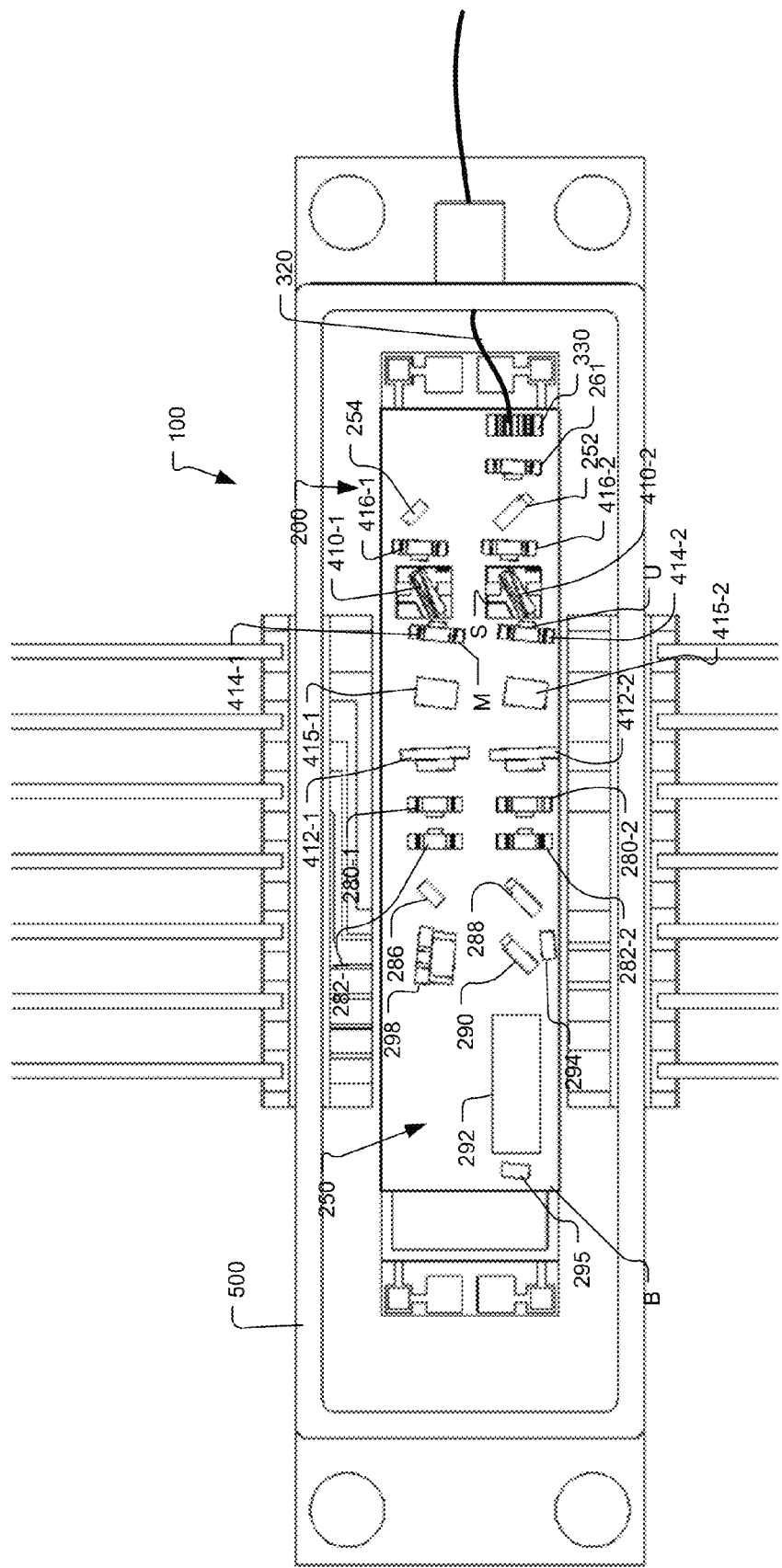
FIG. 5 is a top plan scale drawing of the dual laser swept optical source according to the present invention.

FIG. 5 shows another embodiment of the dual swept optical source 100, using laser sources, and including an integrated laser clock system 250 that has been constructed according to the principles of the present invention.

Generally the integrated dual laser clock system 100 comprises a two tunable laser subsystems, which generates a wavelength or frequency tunable first and second optical signals, and a clock subsystem 250, which generates clock signals at equally spaced frequency increments as the tunable signals or emissions of the laser 100 are spectrally tuned over a spectral scan band(s). The clock signals are used to trigger sampling of the analog to digital converter subsystem 315.

The tunable dual laser subsystem 100, combiner 200, and clock subsystem 250 of the integrated laser system 100 are integrated together on a common optical bench B. This bench B is termed a micro-optical bench and is preferably less than 20 millimeters (mm) by 30-50 mm in size so that it fits within a standard or near standard butterfly or DIP (dual inline package) hermetic package 500. In one implementation, the bench B is fabricated from aluminum nitride. A thermoelectric cooler is disposed between the bench B and the package 500 (attached/solder bonded both to the backside of the bench B and inner bottom panel of the package 500) to control the temperature of the bench B.

In the current implementation, the tunable lasers each comprise semiconductor gain chip 410-1, 410-2 that is paired with a micro-electro-mechanical (MEMS) angled reflective Fabry-Perot tunable filters 412-1, 412-2 to create external cavity laser (ECL) with the tunable filters being an intracavity tuning element and forming one end, or back reflector, of laser cavities.

The semiconductor optical amplifier (SOA) chips 410-1, 410-2 are located within their respective laser cavities. In the current embodiment, both facets of the SOA chip 410-1, 410-2 are angled relative to a ridge waveguide. The SOA chips 410 are mounted on submounts S that, in turn, are mounted on the top side of the optical bench B, typically by solder bonding.

To collect and collimate the light exiting from each end facet of the SOAs 410-1, 410-2, lens structures 414-1, 414-2 and 416-1, 416-2 are used. Each lens structure comprises a LIGA mounting structure M, which is deformable to enable post installation alignment, and a transmissive substrate U on which the lens is formed. The transmissive substrate U is typically solder or thermocompression bonded to the mounting structure M, which in turn is solder bonded to the optical bench B.

The first lens components 414-1, 414-2 couple the light between the input facet of the SOAs 410-1, 410-2 and the tunable filters 412-1, 412-2. Light exiting out the output facets of the SOAs 410-1, 410-2 are coupled by lens component 416-1, 416-2 to optical fiber 320 via its front facet. The optical fiber stub 320 is also preferably solder attached to the optical bench B via a mounting structure 330. The output optical fiber 320 is usually single spatial mode fiber (SMF).

In more detail, fold mirror 254 directs the second optical signal to combiner 252, which is configured according to one of the previous described options. The combined beam is then coupled into optical fiber 320 by lens 261 to the optical fiber facet that is held by mounting structure 330.

The light transmitted by the tunable filters 412-1, 412-2 is coupled out of the laser cavities and into the clock subsystem 250 to be collimated by a third lens component 280-1, 280-2 and fourth lens components 282-1, 282-2 for each tunable laser, which are solder bonded to the optical bench B.

Fold mirror 286 and beam combiner 288 combine the beams from each tunable laser into a common beam. The light then passes through a beam splitter 290, which is preferably a 50/50 splitter to a clock etalon 292. Any light reflected by the splitter 290 is directed to a beam dump component 294 that absorbs the light and prevents parasitic reflections in the hermetic package 500 and into the laser cavities.

The clock etalon 292 functions as a spectral filter. Its spectral features are periodic in frequency and spaced spectrally by a frequency increment related to the length and refractive index of the constituent material of the clock etalon 292, which is fused silica in one example. The physical length of etalon 292 is L. The etalon can alternatively be made of other high-index and transmissive materials such as silicon for compactness, but the optical dispersion of the material may need to be compensated for with additional processing inside the DSP. Also, air-gap etalons, which are nearly dispersionless, are another alternative. Still a further alternative is a free-space interferometer (e.g. a Michelson), which also is dispersionless and is adjusted by simply moving the relative positions of the mirrors.

The contrast of the spectral features of the etalon is determined by the reflectivity of its opposed endfaces. In one example, reflectivity at the etalon endfaces is provided by the index of refraction discontinuity between the constituent material of the etalon and the surrounding gas or vacuum. In other examples, the opposed endfaces are coated with metal or preferably dielectric stack mirrors to provide higher reflectivity and thus contrast to the periodic spectral features.

In the illustrated example, the clock etalon 292 is operated in reflection. The light returning from the clock etalon 292 and reflected by beamsplitter 290 is detected by detector 298. The light detected by detector 298 is characterized by drops and rises in power as the frequency of the tunable signal scans through the reflective troughs/reflective peaks provided by the clock etalon 298. Light transmitted by the etalon 292 is collected by beam dump 295.

FIG. 6A illustrates the scanning of a conventional swept source. The source sequentially tunes through the wavelength scan band S. This is the repeated in serial scans. The problem is that the scans cannot be performed in close time spacing. Instead there is a gap between successive scans S associated with the retrace period R. While it is possible to scan in both directions, this is typically not feasible since semiconductor gain elements preferably only scan in one direction due to the Bogatov effect. In addition, the mechanical inertia of the MEMS filter prevents a quick resweep at high tuning speeds.

FIG. 6B illustrates the scanning of dual swept source according to one example under control of the tuning controller 125. Here, a first of optical signal is scanned as illustrated by scan S1. Then, a second tunable optical signal is scanned as illustrated by scan S2. The process is then repeated for subsequent scans. In this embodiment, the scans for each of the two optical signals occur over the same wavelength scan bands. The duty cycle is in effect doubled. In this example, a combiner 200 that implements a beam switch can be used due to the time multiplexed nature of the tunable optical signal scans S1, S2. Alternatively, the first swept source and the second swept source are alternately energized such that only one is emitting at any given time. As such, a partially reflecting element or mirror is used as the combining element 252, in the simplest implementation.

FIG. 6C illustrates the scanning of the dual swept source according to still another example. Here each of the scans S1, S2 have different polarizations as indicated by the inset arrows. Thus while in this example a beam switch combiner 200 could be used, in the preferred embodiment, the combiner 200 utilizes a polarization beam combiner.

FIG. 6D illustrates still another example in which these successive scans S1, S2 associated with the first tunable optical signal and the second tunable optical signal occur over contiguous scan bands. Specifically scan S1 occurs at a shorter wavelengths whereas scan S2 occurs over a range of longer wavelengths.

FIG. 6E illustrates still another example in which these successive scans S1, S2 associated with the first tunable optical signal and the second tunable optical signal occur over non-overlapping scan bands. Specifically scan S1 occurs at a shorter wavelengths whereas scan S2 occurs over a range of longer wavelengths that are separated from the scan band of S1 by a guard band. G.

Figure 6F:
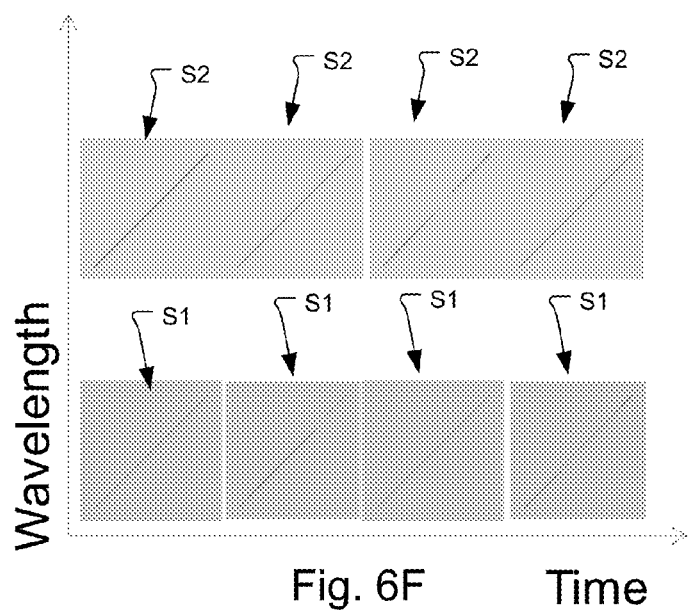

FIG. 6F illustrates still another example in which these successive scans S1, S2 associated with the first tunable optical signal and the second tunable optical signal occur over non-overlapping scan bands, and simultaneously in time. Specifically scan S1 occurs at shorter wavelengths whereas scan S2 occurs over a range of longer wavelengths that are separated from the scan band of S1 by a guard band. G. The scans occur simultaneously with each other using a combination of a WDM combiner 200 and WDM separation at detection as shown in FIG. 2.

Figure 7:
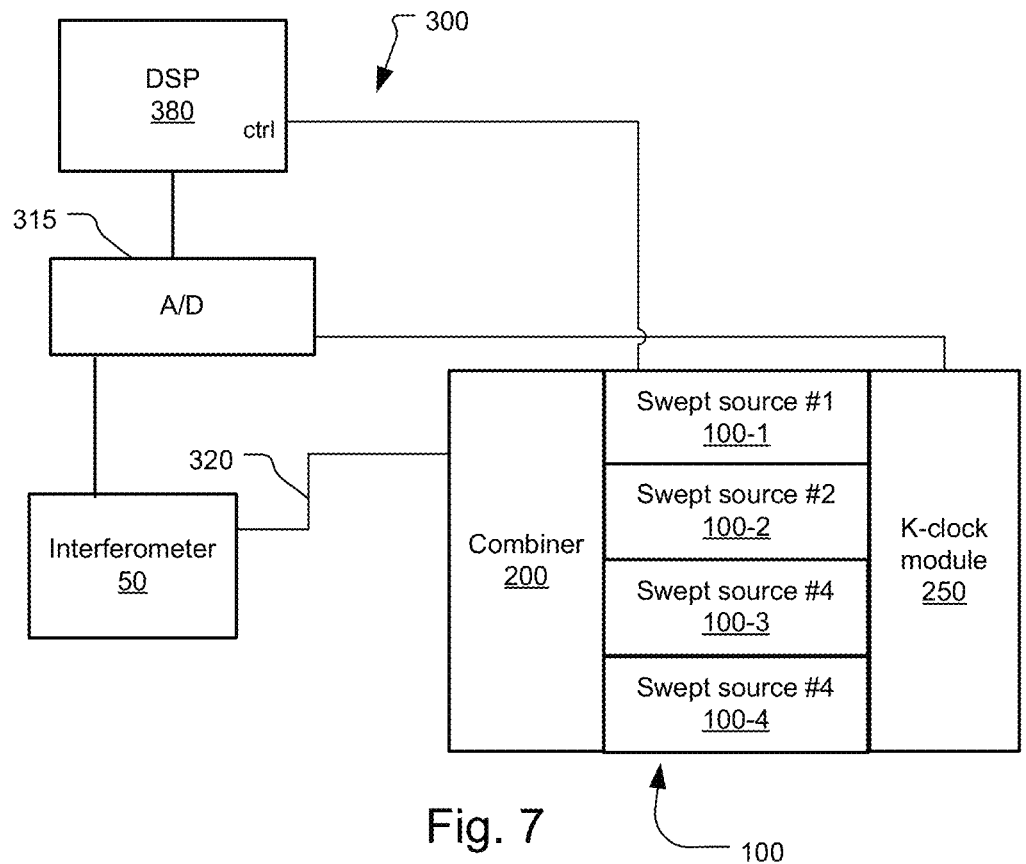
FIG. 7 is a block diagram showing an OCT system with a four swept sources according to another embodiment of the invention.

FIG. 7 shows an optical coherence analysis system 300 using the integrated multiple swept source system 100, which has been constructed according to the principles of the present invention.

The previous examples focused on dual swept source systems. However, in alternative examples, more than two swept sources are included in the integrated swept source system 100. This embodiment illustrates a source system 100 with four swept sources: a first swept source 100-1, a second swept source 100-2, a third swept source 100-3, and a fourth swept source 100-4. Each of these individual swept sources generates respective tunable optical signals, a first optical signal, a second optical signal, a third optical signal, a fourth optical signal, which are combined into the combined optical signal by a combiner 200 and coupled onto the optical fiber 320.

Using four sources has the advantages of higher speed, higher resolution, and 100% duty cycle when using a two detectors system set up as shown in FIG. 2, one for each band. Further, higher speed and polarization sensitivity with four sources using two sources with one polarization and two with another is possibility.

Figure 8A:
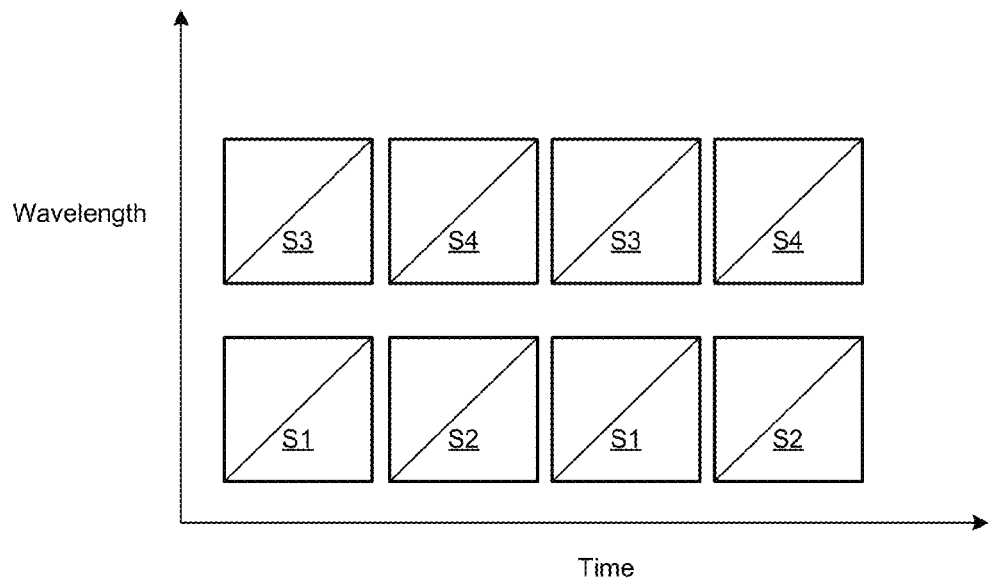
FIGS. 8A and 8B are plots of wavelength as a function of time showing swept source scanning, simultaneously over two and four different scan bands, respectively.
Figure 8B:
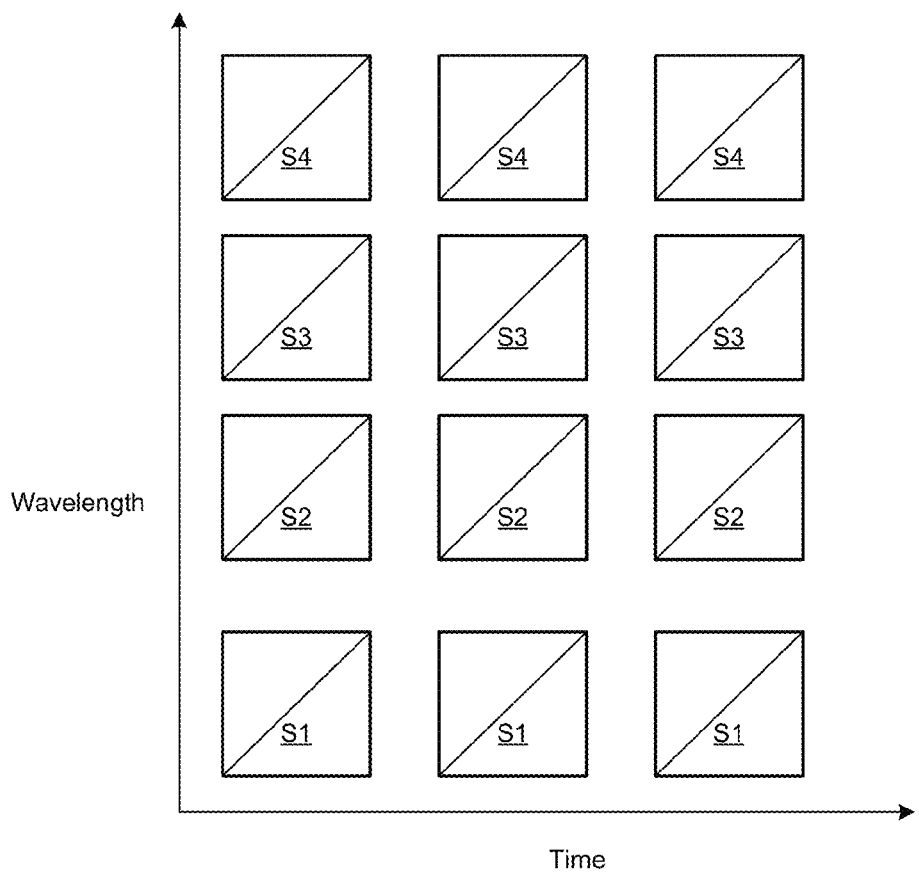

FIG. 8B illustrates the scans S1, S2, S3, S4 associated with the first tunable optical signal, the second tunable optical signal, the third tunable optical signal, the fourth tunable optical signals generated by a first swept source 100-1, a second swept source 100-2, a third swept source 100-3, and a fourth swept source 100-4, respectively. In this example, the scans S1, S2 take place over a first scan band with 100%, or near 100% duty cycle. Likewise scans S3, S4 take place over a second scan band with 100%, or near 100% duty cycle.

FIG. 8B illustrates the successive scans S1, S2, S3, S4 associated with the first tunable optical signal, the second tunable optical signal, the third tunable optical signal, the fourth tunable optical signals generated by a first swept source 100-1, a second swept source 100-2, a third swept source 100-3, and a fourth swept source 100-4, respectively. In this example, the scans S1, S2, S3, S4 occur over non-overlapping scan bands, and simultaneously in time.

Figure 9:
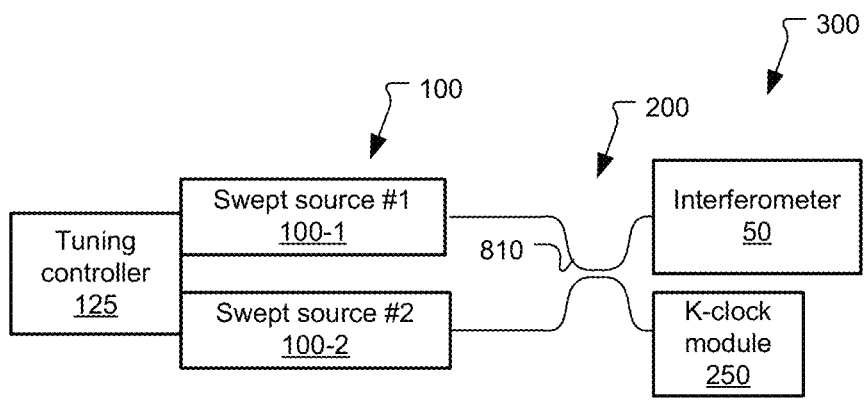
FIG. 9 is a block diagram showing an OCT system with dual swept sources according to another, non-integrated embodiment of the invention.

FIG. 9 shows an optical coherence analysis system 300 using a non-integrated dual swept source 100, which has been constructed according to the principles of the present invention.

The previous examples focused on integrated swept source systems. However, in alternative examples, the two swept sources 100-1, 100-2 are separately packaged in separate hermetic butterfly packages. A shared tuning controller 125 runs the swept sources 100-1, 100-2 in the time multiplexed ping pong fashion described above.

The combined optical signal is generated using a fused 2×2 fiber coupler 810 as the combiner 200 with one output port of the coupler providing the input to the interferometer 50 and the other output port providing the input to the k-clock module 250. In a variant of this embodiment, one output from the coupler 810 is used as the reference arm optical signal, the other as the sample arm optical signal in the OCT interferometer 50.

While this invention has been particularly shown and described with references to preferred embodiments thereof, it will be understood by those skilled in the art that various changes in form and details may be made therein without departing from the scope of the invention encompassed by the appended claims.

What is claimed is:

1. An optical coherence analysis system comprising:
    a first swept source that generates a first optical signal that is tuned over a first spectral scan band;
    a second swept source that generates a second optical signal that is tuned over a second spectral scan band;
    a combiner for combining the first optical signal and the second optical signal to form a combined optical signal;
    an interferometer for dividing the combined optical signal between a reference arm and a sample arm leading to a sample, the interferometer including a detector system for detecting an interference signal generated from the combined optical signal from the reference arm and from the sample arm, wherein the detector system comprises a first detector for detecting the interference signal resulting from the first optical signal and a second detector for detecting the interference signal resulting from the second optical signal; and
    a polarization beam splitter for separating the interference signal into components resulting from the first optical signal and the second optical signal for detection by the first detector and the second detector.

2. An optical coherence analysis system as claimed in claim 1, wherein each of the first swept source and the second swept source comprises:
- a laser cavity having at least two reflectors, which define the longitudinal cavity modes;
- a semiconductor gain medium in the laser cavity; and
- a tuning element for the laser cavity.

3. An optical coherence analysis system as claimed in claim 2, wherein the tuning element comprises a Fabry-Perot tunable filter.

4. An optical coherence analysis system as claimed in claim 2, wherein the tuning element comprises an angled reflective Fabry-Perot tunable filter.

5. An optical coherence analysis system as claimed in claim 2, wherein the tuning element comprises a MEMS Fabry-Perot tunable filter.

6. An optical coherence analysis system as claimed in claim 1, wherein each of the first swept source and the second swept source comprises:
- a broadband source for generating broadband light; and
- a first tunable filter for spectrally filtering the broadband light from the broadband source to generate a tunable optical signal.

7. An optical coherence analysis system as claimed in claim 6, wherein each of the first swept source and the second swept source further comprises:
- an amplifier for amplifying the tunable optical signal to generate an amplified tunable optical signal; and
- a second tunable filter for spectrally filtering the amplified tunable optical signal from the amplifier.

8. An optical coherence analysis system as claimed in claim 6, wherein the first tunable filter comprises a Fabry-Perot tunable filter.

9. An optical coherence analysis system as claimed in claim 6, wherein the first tunable filter comprises a MEMS Fabry-Perot tunable filter.

10. An optical coherence analysis system as claimed in claim 6, wherein the broadband source is a superluminescent light emitting diode.

11. An optical coherence analysis system as claimed in claim 6, wherein the broadband source is a semiconductor optical amplifier.

12. An optical coherence analysis system as claimed in claim 1, further comprising:
- a processing system for constructing an image from a response of the detector system.

13. An optical coherence analysis system as claimed in claim 1, wherein the combiner comprises a WDM combiner.

14. An optical coherence analysis system as claimed in claim 1, wherein the combiner comprises a polarization beam combiner.

15. An optical coherence analysis system as claimed in claim 1, wherein the combiner comprises a beam switch.

16. An optical coherence analysis system as claimed in claim 1, wherein the first optical signal and the second optical signal have orthogonal polarizations with respect to each other.

17. An optical coherence analysis system comprising:
- a first swept source that generates a first optical signal that is tuned over a first spectral scan band;
- a second swept source that generates a second optical signal that is tuned over a second spectral scan band;
- a combiner for combining the first optical signal and the second optical signal to form a combined optical signal;
- an interferometer for dividing the combined optical signal between a reference arm and a sample arm leading to a sample, the interferometer including a detector system for detecting an interference signal generated from the combined optical signal from the reference arm and from the sample arm, wherein the detector system comprises a first detector for detecting the interference signal resulting from the first optical signal and a second detector for detecting the interference signal resulting from the second optical signal;
- a tuning controller for controlling the tuning of the first optical signal over the first spectral scan band by the first swept source and the tuning of the second optical signal over the second spectral scan band by the second swept source; and
- a polarization beam splitter for separating the interference signal for detection by the first detector and the second detector.

* * * * *